United States Patent
Mancera et al.

(10) Patent No.: US 7,576,434 B2
(45) Date of Patent: Aug. 18, 2009

(54) WAFER-LEVEL SOLDER BUMPS

(75) Inventors: Raul Mancera, Chandler, AZ (US); James Lake, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/821,867

(22) Filed: Jun. 26, 2007

(65) Prior Publication Data

US 2009/0001568 A1 Jan. 1, 2009

(51) Int. Cl.
*H01L 23/48* (2006.01)
(52) U.S. Cl. ........................ 257/777; 257/778
(58) Field of Classification Search .............. 257/723, 257/777, 778, 686, 737, 738
See application file for complete search history.

(56) References Cited

U.S. PATENT DOCUMENTS

| 6,340,845 | B1* | 1/2002 | Oda | 257/777 |
| 7,279,795 | B2* | 10/2007 | Periaman et al. | 257/777 |
| 7,352,067 | B2* | 4/2008 | Fukaishi et al. | 257/777 |

OTHER PUBLICATIONS

U.S. Appl. No. 11/321,669, filed Dec. 29, 2005, entitled, "A Stacked Die Semiconductor Package," by Shanggar Periaman, et al.

* cited by examiner

*Primary Examiner*—Roy K Potter
(74) *Attorney, Agent, or Firm*—Trop, Pruner & Hu, P.C.

(57) ABSTRACT

In one embodiment, the present invention includes a semiconductor package having a support substrate coupled to a first semiconductor die, where the first semiconductor die includes first conductive bumps, and a second semiconductor die includes second conductive bumps, and where the first and second die are coupled by joints formed of the first and second conductive bumps and a solder material therebetween. Other embodiments are described and claimed.

14 Claims, 3 Drawing Sheets

WAFER-LEVEL SOLDER BUMPS

BACKGROUND

In semiconductor packaging technologies, various methods can be used to package a semiconductor die. For example, many of today's semiconductors are packaged using so-called flip-chip technology in which a semiconductor die is attached to an underlying substrate of the package using conductive bumps.

Furthermore, semiconductor devices are being formed that include so-called through silicon vias (TSVs), which provide an electrical connection between a front side and backside of a semiconductor die, enabling interconnection of multiple die within a single package. To form such a three-dimensional die stack using TSV technology, solder bumps are formed on a die using evaporation, electroplating or screen printing technologies. However, each of these technologies suffers from drawbacks. Furthermore, an additional flux deposition is needed before a die is stacked onto an underlying die. However, this process can create high yield losses due to misalignment, particularly given the thinness and lack of tackiness of the low-viscosity flux.

DETAILED DESCRIPTION

In various embodiments, a solder dipping process may be used to apply solder bump material in a paste form to conductive bumps on a die. In this way, fine-pitch solder joint interconnects may be achieved. For example, in some implementations pitches below 150 microns (μms) may be achieved. Also, by implementing a solder dipping process, a variety of binary and ternary alloys may be used for the solder. Paste dip processes may also be implemented into high volume manufacturing (HVM) processes, as conventional pick and place and reflow equipment may be used. Embodiments may further be effective with thin die, as the only pressure applied is when the die is dipped into a paste reservoir.

Embodiments may provide both flux tackiness and prevention of misalignment, as the solder in paste form may allow only the conductive bumps on the die to be embedded in the paste. That is, such a paste dip method only embeds the bumps in the flux and not the entire die or substrate. Accordingly, there is much less flux residue after a solder reflow process. Accordingly, the likelihood of delamination of semiconductor layers such as a die passivation layer, due to coefficient of thermal expansion (CTE) mismatches with an underfill epoxy may be avoided.

Figure 1A:
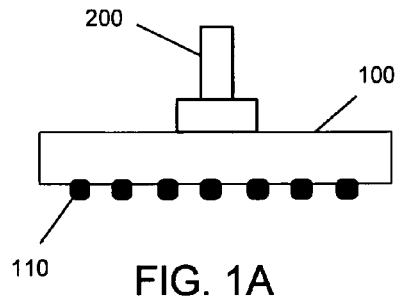
FIGS. 1A-1E are process steps of a method in accordance with an embodiment of the present invention.
Figure 1B:
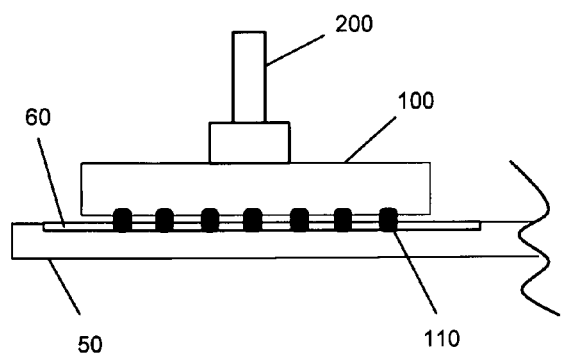
Figure 1C:
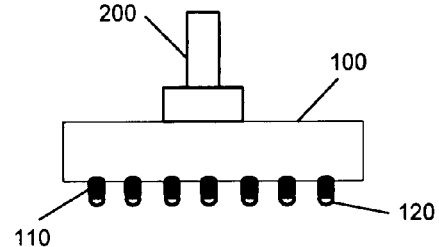

Referring now to FIGS. 1A-1E, shown are process steps of a method in accordance with an embodiment of the present invention. As shown in FIG. 1A, a solder paste dipping process may first be performed in which a die 100, which may include a plurality of conductive bumps 110, e.g., copper (Cu) bumps may be adapted to a pick and place tool 200. Next the pick and place tool 200 may move die 100 to a reservoir 50 including a solder paste 60, as shown in FIG. 1B. In this way, solder paste caps 120 may be adapted to a tip of conductive bumps 110 as shown in FIG. 1C. Note that in the embodiment of FIG. 1B, only conductive bumps 110 are inserted into paste 60. In some embodiments, this paste dipping process may be performed prior to a dicing operation at a wafer level where die 100 is part of a semiconductor wafer.

Different formulations for the solder paste may exist in different embodiments. For example, different design rules for selecting a powder type (e.g., size of metallic particles) may depend on a diameter of conductive bump 110. In some implementations an average of approximately 10 particles across a bump diameter may be needed for complete paste transfer. Thus the smaller the bump's pitch and diameter, the smaller the particle diameter that may be mixed with fluxing agents to form a solder paste. For example, in some implementations, particle diameter may be less than approximately 15 microns. In various embodiments, a solder paste may have a composition that includes metallic particles, e.g., one or more of tin (Sn), silver (Ag), indium (In), copper (Cu), gold (Au), bismuth (Bi), and solder alloys, e.g., Au80/Sn20, Sn48/In52, Sn42/Bi58, Sn96.5/Ag3.0/Cu0.5, Sn96.5/Ag3.5, or Sn85/In14/Cu1.0, as well as one or more fluxing agents such as 2,2'-oxybisacetic acid, propylene glycol, cyclohexanol, and pimelic acid. In various embodiments, the composition may be approximately 60 to 80 percent metallic particles and 20 to 40 percent fluxing agent, although the scope of the present invention is not limited in this regard.

Figure 1D:
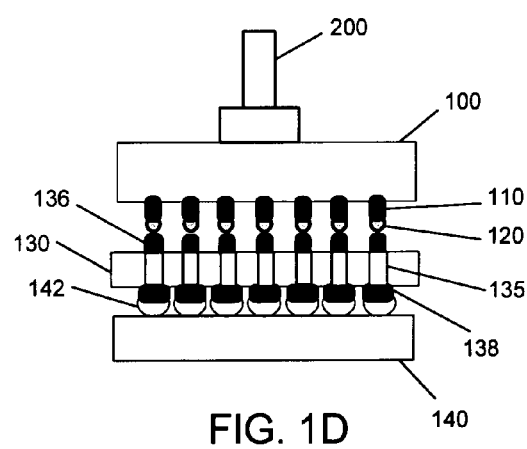

Referring now to FIG. 1D, next die 100 may be placed onto another wafer, namely wafer 130 to form a three-dimensional (3D) die stack. Specifically, wafer 130 includes a plurality of TSVs 135 which act to electrically couple corresponding conductive bumps 138, e.g., Cu bumps, on a frontside of wafer 130 to corresponding conductive bumps 136, which may be Cu pillars, on a backside of wafer 130. Note also in FIG. 1D that wafer 130 may be adapted to a substrate 140 which, in some embodiments may be a coreless substrate, by corresponding interconnects 142 which, in some embodiments may be controlled collapse chip connect (C4) interconnects.

Figure 1E:
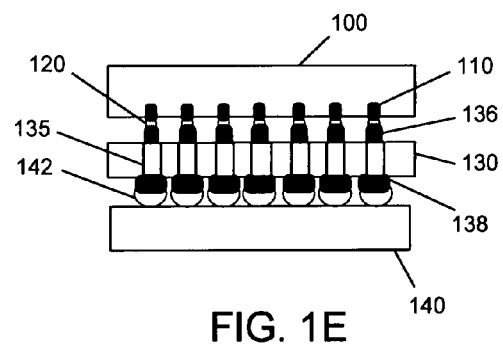

Thus using the solder paste dipping and chip attach process set forth in FIGS. 1A-1D, a resulting 3D die stack may be formed, as shown in FIG. 1E. In addition to the process steps set forth above, additional process steps may be performed such as one or more solder reflow processes, an underfill process, a curing process and so forth.

Figure 2:
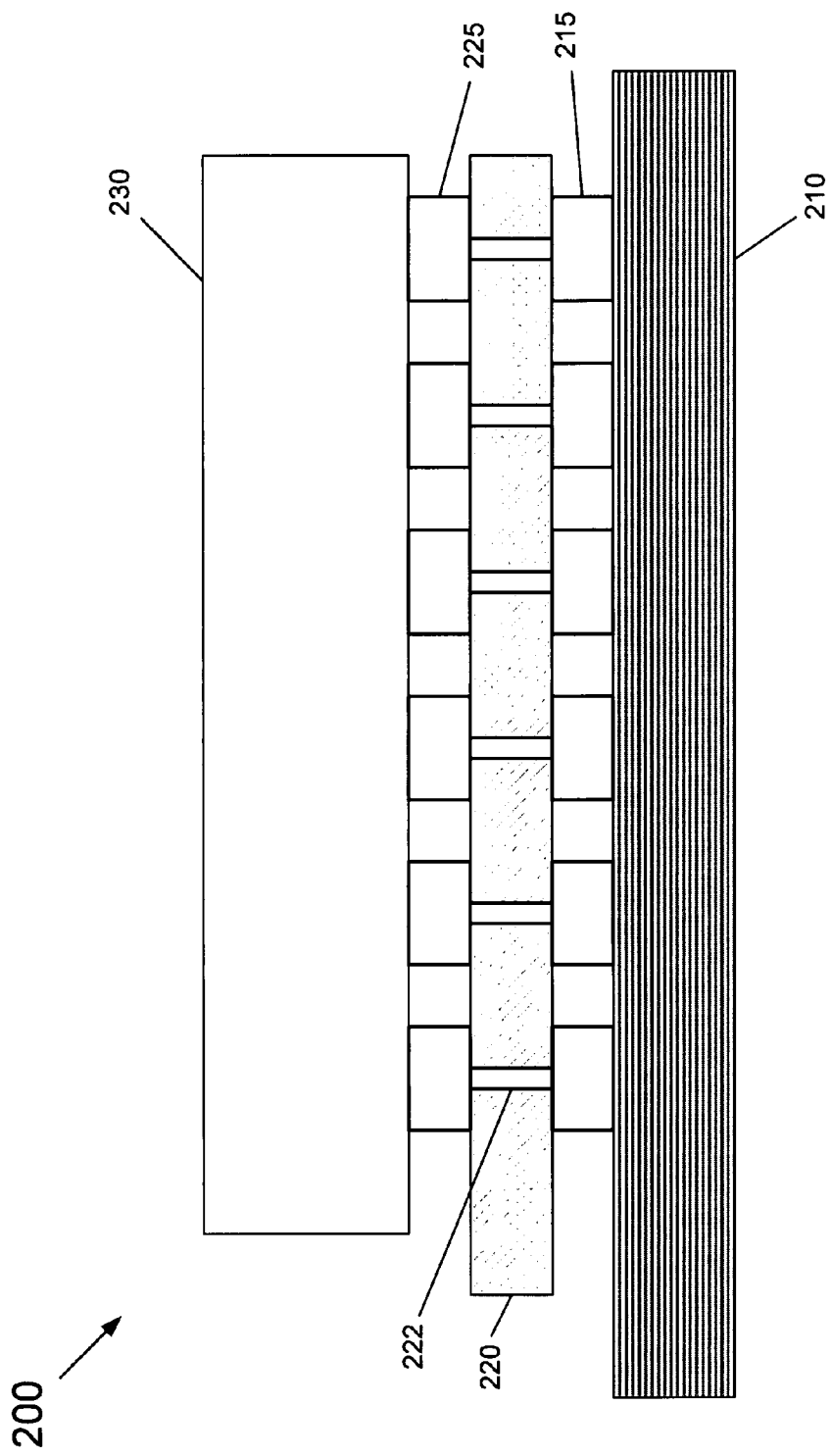
FIG. 2 is a cross-section view of a three dimensional die stack in accordance with one embodiment of the present invention.

Referring now to FIG. 2, shown is a cross-section view of a three dimensional die stack in accordance with one embodiment of the present invention. As shown in FIG. 2, die stack 200 may include a pair of dies namely a first die 220 and a second die 230. Note that in the embodiment of FIG. 2, first die 220 may be a relatively thin die. For example, in some implementations this die may have a thickness of less than approximately 100 microns. As one example, first die 220 may correspond to a memory device such as a semiconductor memory, e.g., a dynamic random access memory (DRAM), a non-volatile memory such as a flash memory or the like. First die 220 includes a plurality of TSVs 222 to provide interconnection between front side and backside of the die.

As further shown in FIG. 2, first die 220 may be coupled to an underlying package substrate 210 which, in some embodiments may be a multi-layer coreless substrate to provide power and data connections to the die of the package. A plurality of interconnects 215, which may be C4 contacts may be used to couple first die 220 to package substrate 210.

Still referring to FIG. 2, second die 230 may be a relatively thicker die, which may correspond to a processor, chipset or any other such semiconductor component. First die 220 and second die 230 may be coupled by a plurality of interconnects 225. Interconnects 225 may be a joint formed from conductive bumps on both of the die, as well as a solder paste applied to one or both of the die, e.g., using the solder paste dipping methods set forth above with regard to FIGS. 1A-1C. Thus joints 225 may be formed of a Cu-solder-Cu sandwich. While shown with this particular implementation in the embodiment of FIG. 2, the scope of the present invention is not limited in this regard.

Thus various embodiments may provide for a paste dip material that can be used with no clean flux chemistry. Accordingly, the no flux chemistry may eliminate a process step (i.e., a de-flux process). By using a paste dip approach in accordance with an embodiment of the present invention, only conductive bumps of a die may be wetted with flux, rather than conventional flux spraying methods in which an entire substrate surface is covered with flux. Accordingly, delamination between a die passivation layer and an underfill material such as a capillary underfill epoxy may be avoided. Furthermore, embodiments that embed the conductive bumps in a paste prevent die floats (i.e., die misalignment), which is characteristic of no clean fluxes due to their lack of tackiness.

Figure 3:
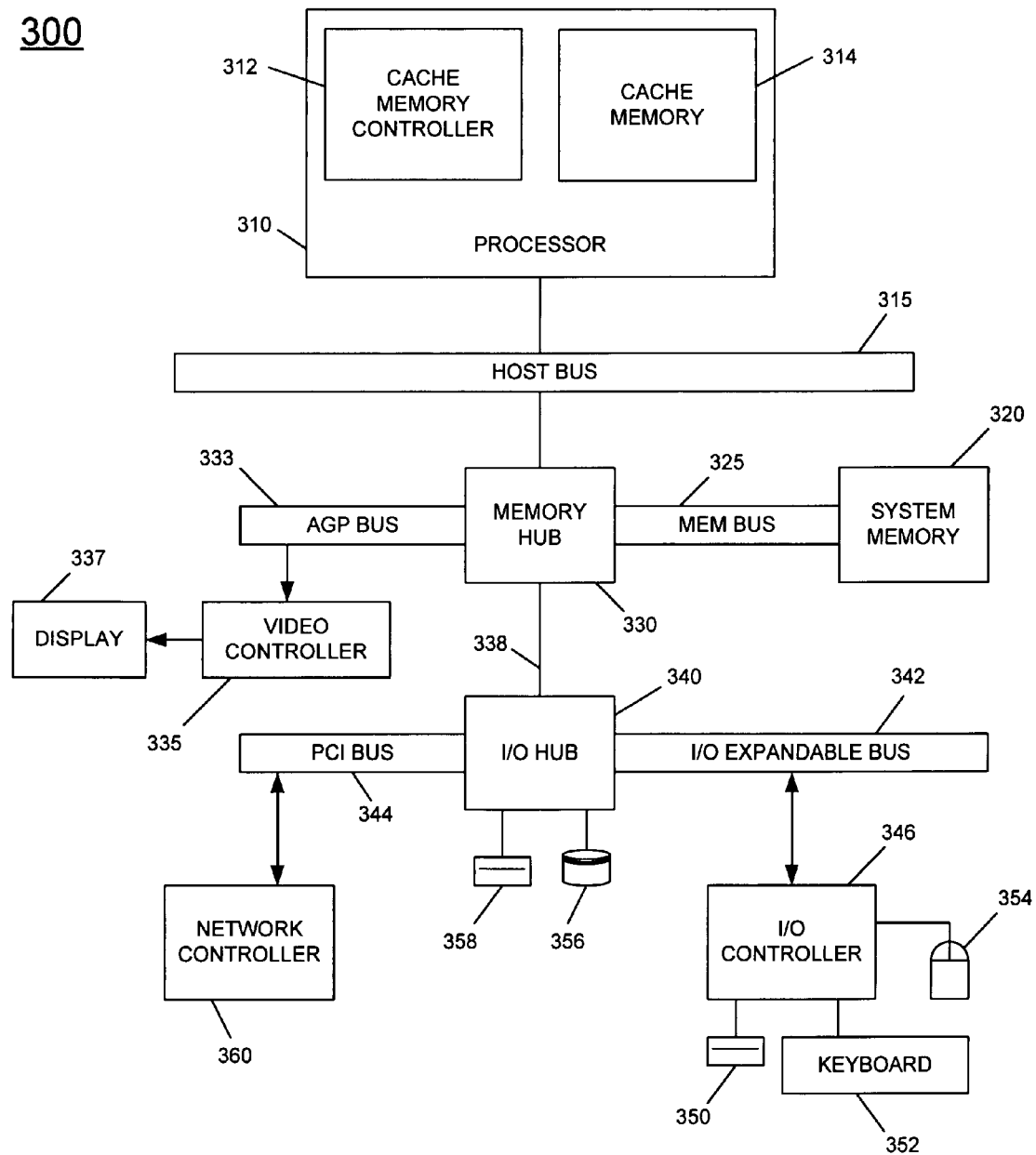
FIG. 3 is a block diagram of a system in accordance with one embodiment of the present invention.

Semiconductor packages in accordance with an embodiment may be used in various systems. FIG. 3 is a block diagram of a computer system 300 in which embodiments of the invention may be used. As used herein, the term "computer system" may refer to any type of processor-based system, such as a notebook computer, a server computer, a laptop computer, or the like.

Now referring to FIG. 3, in one embodiment, computer system 300 includes a processor 310, which may include a general-purpose or special-purpose processor such as a microprocessor, microcontroller, a programmable gate array (PGA), and the like. Processor 310 may include a cache memory controller 312 and a cache memory 314. Processor 310 may be coupled over a host bus 315 to a memory hub 330 in one embodiment, which may be coupled to a system memory 320 (e.g., a dynamic RAM) via a memory bus 325. Memory hub 330 may also be coupled over an Advanced Graphics Port (AGP) bus 333 to a video controller 335, which may be coupled to a display 337.

Memory hub 330 may also be coupled (via a hub link 338) to an input/output (I/O) hub 340 that is coupled to an input/output (I/O) expansion bus 342 and a Peripheral Component Interconnect (PCI) bus 344, as defined by the PCI Local Bus Specification, Production Version, Revision 2.1 dated June 1995. In one embodiment, processor 310 and system memory 320 (at least) may be stacked in a single package in accordance with an embodiment of the present invention and coupled, e.g., through a socket to a circuit board of system 300.

I/O expansion bus 342 may be coupled to an I/O controller 346 that controls access to one or more I/O devices. As shown in FIG. 3, these devices may include in one embodiment storage devices, such as a floppy disk drive 350 and input devices, such as a keyboard 352 and a mouse 354. I/O hub 340 may also be coupled to, for example, a hard disk drive 358 and a compact disc (CD) drive 356, as shown in FIG. 3. It is to be understood that other storage media may also be included in the system.

PCI bus 344 may also be coupled to various components including, for example, a network controller 360 that is coupled to a network port (not shown). Additional devices may be coupled to the I/O expansion bus 342 and the PCI bus 344. Although the description makes reference to specific components of system 300, it is contemplated that numerous modifications and variations of the described and illustrated embodiments may be possible.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A semiconductor package comprising:
   a support substrate to provide power and data connections to a first semiconductor die;
   the first semiconductor die having first circuitry comprising a memory device, wherein the first semiconductor die is coupled to the support substrate on a first side of the first semiconductor die by a first plurality of interconnects, the first semiconductor die including a first plurality of conductive bumps on a second side thereof;
   a second semiconductor die having second circuitry comprising a processor and including a second plurality of conductive bumps, wherein the second semiconductor die is coupled to the first semiconductor die by joints formed of the first and second plurality of conductive bumps and a solder material therebetween.

2. The semiconductor package of claim 1, wherein the first semiconductor die includes a plurality of through silicon vias (TSVs) to couple the second semiconductor die to the support substrate.

3. The semiconductor package of claim 1, wherein the first plurality of conductive bumps and the second plurality of conductive bumps comprise copper (Cu) bumps and the solder material includes conductive particles.

4. The semiconductor package of claim 3, wherein the solder material is applied to one of the first plurality of conductive bumps and second plurality of conductive bumps in a paste form, and wherein the paste form is applied to the first plurality of conductive bumps or the second plurality of conductive bumps and not the cofrresponding first or second semiconductor die.

5. The semiconductor package of claim 3, wherein the conductive particles have a diameter of less than approximately 15 microns.

6. The semiconductor package of claim 1, wherein the first semiconductor die has a thickness of less than approximately 100 microns.

7. An apparatus comprising:
   a first wafer including a first semiconductor die having first circuitry comprising a memory device, wherein the first semiconductor die is to be coupled to a support substrate on a first side of the first semiconductor die by a first plurality of interconnects, the first semiconductor die including a first plurality of conductive bumps on a second side thereof and a plurality of through silicon vias (TSVs) to provide interconnections between the first and second sides of the first semiconductor die; and
   a second wafer including a second semiconductor die having second circuitry comprising a processor and including a second plurality of conductive bumps, wherein the second semiconductor die is coupled to the first semiconductor die by joints formed of the first and second plurality of conductive bumps and a solder material therebetween.

8. The apparatus of claim 7, wherein the first plurality of conductive bumps and the second plurality of conductive bumps comprise copper (Cu) bumps and the solder material includes conductive particles.

9. The apparatus of claim 7, wherein the solder material is applied to one of the first plurality of conductive bumps and second plurality of conductive bumps in a paste form, and wherein the paste form is applied to the first plurality of conductive bumps or the second plurality of conductive bumps and not the corresponding first or second semiconductor die.

10. A semiconductor package comprising:
   a coreless substrate to provide power and data connections to a first semiconductor die;
   the first semiconductor die having first circuitry, wherein the first semiconductor die is coupled to the coreless substrate on a first side of the first semiconductor die by a first plurality of interconnects, the first semiconductor die including a first plurality of conductive bumps on a second side thereof; and
   a second semiconductor die having second circuitry and including a second plurality of conductive bumps, wherein the second semiconductor die is coupled to the first semiconductor die by joints formed of the first and second plurality of conductive bumps and a solder material therebetween.

11. The semiconductor package of claim 10, wherein the first semiconductor die includes a plurality of through silicon vias (TSVs) to couple the second semiconductor die to the support substrate.

12. The semiconductor package of claim 10, wherein the first plurality of conductive bumps and the second plurality of conductive bumps comprise copper (Cu) bumps and the solder material includes conductive particles.

13. The semiconductor package of claim 12, wherein the solder material is applied to one of the first plurality of conductive bumps and second plurality of conductive bumps in a paste form, and wherein the paste form is applied to the first plurality of conductive bumps or the second plurality of conductive bumps and not the corresponding first or second semiconductor die.

14. The semiconductor package of claim 10, wherein the first circuitry comprises a memory device and the second circuitry comprises a processor.

* * * * *